(12) United States Patent
Mu et al.

(10) Patent No.: US 10,325,693 B2
(45) Date of Patent: *Jun. 18, 2019

(54) COPPER-CONTAINING CONDUCTIVE PASTES AND ELECTRODES MADE THEREFROM

(71) Applicant: E I DU PONT DE NEMOURS AND COMPANY, Wilmington, DE (US)

(72) Inventors: Minfang Mu, Shanghai (CN); Yundan Wu, Shanghai (CN)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 158 days.

This patent is subject to a terminal disclaimer.

(21) Appl. No.: 15/505,690

(22) PCT Filed: Aug. 28, 2014

(86) PCT No.: PCT/CN2014/085386
§ 371 (c)(1),
(2) Date: Feb. 22, 2017

(87) PCT Pub. No.: WO2016/029400
PCT Pub. Date: Mar. 3, 2016

(65) Prior Publication Data
US 2017/0287587 A1    Oct. 5, 2017

(51) Int. Cl.
| | | |
|---|---|---|
| H01B 1/22 | (2006.01) | |
| B22F 7/08 | (2006.01) | |
| C22C 9/00 | (2006.01) | |
| H01B 1/16 | (2006.01) | |
| H01L 31/0224 | (2006.01) | |
| B22F 1/00 | (2006.01) | |
| C22C 32/00 | (2006.01) | |

(52) U.S. Cl.
CPC ............. *H01B 1/22* (2013.01); *B22F 1/0003* (2013.01); *B22F 1/0074* (2013.01); *B22F 7/08* (2013.01); *C22C 9/00* (2013.01); *C22C 32/0089* (2013.01); *H01B 1/16* (2013.01); *H01L 31/0224* (2013.01); *H01L 31/022425* (2013.01); *B22F 1/0014* (2013.01); *Y02E 10/50* (2013.01)

(58) Field of Classification Search
CPC .... H01B 1/16; H01B 1/22; C09D 5/24; B22F 7/08
USPC .......................................................... 148/23
See application file for complete search history.

(56) References Cited

U.S. PATENT DOCUMENTS

| | | |
|---|---|---|
| 4,273,583 A | 6/1981 | Tyran |
| 4,331,714 A | 5/1982 | Tyran |
| 4,388,347 A | 6/1983 | Shum et al. |
| 5,296,413 A | 3/1994 | Carroll et al. |
| 5,442,145 A | 8/1995 | Imai et al. |
| 7,316,725 B2 | 1/2008 | Kodas et al. |
| 7,572,314 B2 | 8/2009 | Choi et al. |
| 8,647,815 B1 | 2/2014 | Kuroki et al. |
| 2004/0051085 A1 | 3/2004 | Moriya |
| 2010/0108366 A1 | 5/2010 | Kim et al. |
| 2011/0003246 A1 | 1/2011 | Kuroki |
| 2011/0031448 A1 | 2/2011 | Ota et al. |
| 2011/0180137 A1 | 7/2011 | Iwamuro et al. |
| 2011/0203659 A1 | 8/2011 | Carroll et al. |
| 2011/0315217 A1 | 12/2011 | Gee |
| 2012/0090882 A1 | 4/2012 | Ishimatsu et al. |
| 2012/0240994 A1 | 9/2012 | Kim et al. |
| 2012/0312368 A1 | 12/2012 | Hang et al. |
| 2013/0321979 A1 | 12/2013 | Park et al. |
| 2014/0191167 A1 | 7/2014 | Huang et al. |
| 2017/0287587 A1 | 10/2017 | Mu et al. |

FOREIGN PATENT DOCUMENTS

| | | |
|---|---|---|
| CN | 1072940 A | 6/1993 |
| CN | 1495804 A | 5/2004 |
| CN | 1529918 A | 9/2004 |
| CN | 101061243 A | 10/2007 |
| CN | 101246759 A | 8/2008 |
| CN | 101441904 A | 5/2009 |
| CN | 102290453 A | 12/2011 |
| CN | 102473563 A | 5/2012 |
| CN | 103310870 A | 9/2013 |
| CN | 103514975 A | 1/2014 |
| CN | 103515480 A | 1/2014 |
| CN | 103578561 A | 2/2014 |
| CN | 103578651 A | 2/2014 |
| GB | 2418432 A | 3/2006 |
| JP | 03-078906 A | 4/1991 |
| JP | 03-176905 A | 7/1991 |
| JP | 05-298917 A | 11/1993 |
| JP | 08-273434 A | 10/1996 |
| JP | 2000-048640 A | 2/2000 |
| JP | 2001-028476 A | 1/2001 |

(Continued)

OTHER PUBLICATIONS

PCT International Search Report for Application No. PCT/CN2014/085386; Chen, Junhong, Authorized Officer; ISA/CN; dated May 8, 2015.

(Continued)

*Primary Examiner* — Weiping Zhu

(57) ABSTRACT

Disclosed herein are copper-containing (Cu-containing) conductive pastes, copper (Cu) electrodes formed by firing the Cu-containing conductive paste over a substrate, and articles comprising a structural element with such Cu electrodes, wherein, the Cu-containing conductive paste contains a powder mixture of Cu, Ge, and B particles dispersed in an organic medium.

13 Claims, No Drawings

(56) References Cited

FOREIGN PATENT DOCUMENTS

| | | |
|---|---|---|
| JP | 2004-002923 A | 1/2004 |
| JP | 2004-104047 A | 4/2004 |
| JP | 2004-156061 A | 6/2004 |
| JP | 2004-156062 A | 6/2004 |
| JP | 2004-162164 A | 6/2004 |
| JP | 2004-232036 A | 8/2004 |
| JP | 2005-136260 A | 5/2005 |
| JP | 2006-019306 A | 1/2006 |
| JP | 2006-225691 A | 8/2006 |
| JP | 2006-225692 A | 8/2006 |
| JP | 2008-138266 A | 6/2008 |
| JP | 2008-255509 A | 10/2008 |
| JP | 2008-270750 A | 11/2008 |
| JP | 2009-081142 A | 4/2009 |
| JP | 2009-135101 A | 6/2009 |
| JP | 2009-235556 A | 10/2009 |
| JP | 2010-013730 A | 1/2010 |
| JP | 2010-126022 A | 6/2010 |
| JP | 2010-196105 A | 9/2010 |
| JP | 2011-006719 A | 1/2011 |
| JP | 2011-006739 A | 1/2011 |
| JP | 2011-006740 A | 1/2011 |
| JP | 2012-076086 A | 4/2012 |
| JP | 2012-157870 A | 8/2012 |
| JP | 2012-179624 A | 9/2012 |
| JP | 2012-532420 | 12/2012 |
| JP | 2013-117053 A | 6/2013 |
| JP | 2013-232609 A | 11/2013 |
| JP | 2014-026953 A | 2/2014 |
| JP | 2014-053287 A | 3/2014 |
| JP | 2017-535024 A | 11/2017 |
| KR | 10-2013-0065445 A | 6/2013 |
| WO | 2012/122409 A2 | 9/2012 |
| WO | 2013/090498 A1 | 6/2013 |
| WO | 2013/154960 A1 | 10/2013 |

OTHER PUBLICATIONS

PCT International Search Report for Application No. PCT/CN2014/085379; Yang, Jia, Authorized Officer; ISA/CN; dated Dec. 16, 2014.

PCT International Search Report for Application No. PCT/CN2014/085377; Wang, Weiwei, Authorized Officer; ISN/CN; dated May 7, 2015.

COPPER-CONTAINING CONDUCTIVE PASTES AND ELECTRODES MADE THEREFROM

FIELD OF THE INVENTION

The invention relates to copper-containing conductive pastes and electrodes prepared therefrom by firing.

BACKGROUND OF THE INVENTION

Precious metal powder, such as silver powder, is used in the electronics industry for the manufacture of conductive pastes. The conductive pastes are screen printed onto substrates forming conductive circuit patterns. These circuits are then dried and fired to volatilize and burn out the liquid organic medium and sinter the metal particles.

Capital investment for the furnace can be decreased when precious metals such as gold, silver, and palladium are used as the conductor because these metals can be fired in air. Using precious metals, however, invites a sharp rise in material costs because precious metals are expensive.

Copper is widely used as a conductive component in semiconductor circuits and the like. Copper has the advantage of being less expensive than silver and other precious metals. However, copper cannot be fired in air because it oxidizes easily, and this increases capital investment because firing under a nitrogen atmosphere and the like is required.

Thus, in the process of forming an electrode using a conductive paste, the development of technology is needed that will satisfy the following requirements of: 1) enabling the use of inexpensive copper powder, 2) enabling firing to be performed in air, and 3) achieving low electrode resistance.

BRIEF SUMMARY OF THE INVENTION

Provided herein is a copper-containing (Cu-containing) conductive paste comprising: (a) about 10-95 wt % of a powder mixture of Cu, germanium (Ge), and boron (B) particles, and (b) about 0.1-15 wt % of a glass fit, dispersed in (c) an organic medium, with the total wt % of all components comprising the paste totaling to 100 wt %, and wherein, (i) the powder mixture comprises about 0.1-35 parts by weight of the Ge particles and about 0.05-15 parts by weight of the B particles, based on 100 parts by weight of the Cu particles, and provided that the combined content level of Ge and B particles is about 35 parts by weight or less; and (ii) the organic medium is comprised of at least one organic polymer dissolved in at least one solvent.

In one embodiment of the Cu-containing conductive paste, the powder mixture comprises about 0.1-25 parts by weight of the Ge particles and about 0.1-12 parts by weight of the B particles, based on 100 parts by weight of the Cu particles, and provided that the combined content level of Ge and B particles is about 25 parts by weight or less.

In a further embodiment of the Cu-containing conductive paste, the powder mixture comprises about 0.2-13 parts by weight of the Ge particles and about 0.1-6.5 parts by weight of the B particles, based on 100 parts by weight of the Cu particles, and provided that the combined content level of Ge and B particles is about 12.5 parts by weight or less.

In a yet further embodiment of the Cu-containing conductive paste, the Cu particles have a particle diameter (D50) of about 1-50 µm.

In a yet further embodiment of the Cu-containing conductive paste, the Cu particles have a particle diameter (D50) of about 1.5-30 µm.

In a yet further embodiment of the Cu-containing conductive paste, the Cu particles have a particle diameter (D50) of about 1.5-15 µm.

In a yet further embodiment of the Cu-containing conductive paste, wherein, the Ge particles have a particle diameter (D50) of about 1-1000 nm, and the B particles have a particle diameter (D50) of about 1-1000 nm.

Further provided herein is an article comprising a structural element, wherein the structural element is comprised of a substrate and at least one Cu electrode, wherein the at least one Cu electrode is formed by: (I) applying a Cu-containing conductive paste onto one side of the substrate in a predetermined shape and at a predetermined position; (II) drying the Cu-containing conductive paste; and (III) firing the Cu-containing conductive paste to form the at least one Cu electrode, wherein, the Cu-containing conductive paste comprises: (a) about 10-95 wt % of a powder mixture of Cu, Ge, and B particles, and (b) about 0.1-15 wt % of a glass frit, dispersed in (c) an organic medium, with the total wt % of all components comprised in the paste totaling to 100 wt %, and wherein, (i) the powder mixture comprises about 0.01-35 parts by weight of the Ge particles and about 0.05-15 parts by weight of the B particles, based on 100 parts by weight of the Cu particles; and (ii) the organic medium is comprised of at least one organic polymer dissolved in at least one solvent.

In one embodiment of the article, during step (III), the Cu-containing conductive paste is fired in air.

In a further embodiment of the article, during step (III), the Cu-containing conductive paste is fired in air for about 3 min to 2 hr.

In a yet further embodiment of the article, during step (III), the Cu-containing conductive paste is fired in air for about 3 min to 1 hr.

In a yet further embodiment of the article, during step (III), the Cu-containing conductive paste is fired in air for about 3-18 min.

In a yet further embodiment of the article, the article is selected from the group consisting of hybrid integrated circuit, resistors, ceramic capacitors, super capacitors, resistive heaters, and fuel sensors.

DETAILED DESCRIPTION OF THE INVENTION

Disclosed herein are copper-containing (Cu-containing) conductive pastes, copper (Cu) electrodes formed by firing the Cu-containing conductive paste over a substrate, and articles comprising a structural element with such Cu electrodes.

Cu-Containing Conductive Pastes

The Cu-containing conductive pastes disclosed herein contain inorganic powder such as a powder mixture of Cu, germanium (Ge), and boron (B) particles and glass flits dispersed into an organic medium to form the "paste", which has suitable viscosity for applying on a substrate.

The glass frit includes fusible oxides, such as glass formers, intermediate oxides, and/or modifiers. The term "fusible," as used herein, refers to the ability of a material to become fluid upon heating, such as the heating employed in a firing operation. In some embodiments, the fusible material is composed of one or more fusible subcomponents, For example, the fusible material may comprise a glass material, or a mixture of two or more glass materials. Glass material in the form of a fine powder, e.g., as the result of a comminution operation, is often termed "frit" and is readily incorporated in the present paste composition. The glass frit may be crystalline, partially crystalline, amorphous, partially amorphous or combinations thereof.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic dares gives rise to the narrow peaks, whose position in reciprocal space is in accordance with Bragg's law. A glass material also does not show a substantial crystallization exotherm upon heating close to or above its glass transition temperature or softening point, Tg, which is defined as the second transition point seen in a differential thermal analysis (DTA) scan. In an embodiment, the softening point of glass material used in the present paste composition is in the range of 300 to 800° C.

It is also contemplated that some or all of the oxides in glass frits may be composed of material that exhibits some degree of crystallinity. For example, in some embodiments, a plurality of oxides are melted together, resulting in a material that is partially amorphous and partially crystalline. As would be recognized by a skilled person, such a material would produce an X-ray diffraction pattern having narrow, crystalline peaks superimposed on a pattern with broad, diffuse peaks. Alternatively, one or more constituents, or even substantially all of the fusible material, may be predominantly or even substantially fully crystalline. In an embodiment, crystalline material useful in the fusible material of the present paste composition may have a melting point of at most 800° C.

In particular, the Cu-containing conductive paste disclosed herein comprises (i) a powder mixture of Cu, Ge, and B particles and (ii) a glass frit, dispersed in (iii) an organic medium. And the paste has suitable viscosity for applying on a substrate. The viscosity of the Cu-containing conductive paste may be about 0.05-5000 Pa-s at shear rate between about 0.2-350 s$^{-1}$. In certain embodiments, a viscosity of 5-800 Pa-s is preferred when screen printing is employed.

(i) Powder Mixtures of Cu, Ge, and B Particles

The Cu particles used herein can be pure Cu, or a Cu alloy with nickel, silver, aluminum, zinc, tin, silicon, iron, manganese, germanium, boron, or mixtures thereof. Among them, Cu alloys with zinc, tin, aluminum, silicon, or mixtures thereof are preferred. The pure Cu can have purity of at least about 80% Cu in one embodiment, at least about 90% Cu in another embodiment, or at least about 96% Cu in yet another embodiment.

A skilled person would recognize that the choice of raw materials could unintentionally include impurities that may be incorporated into the Cu during processing. For example, the impurities may be present in the range of hundreds to thousands of parts per million. Impurities commonly occurring in industrial metals used herein are known to one of ordinary skill.

Particle diameter (D50) of the Cu particles can be about 1-50 μm in one embodiment, about 1.5-30 μm in another embodiment, or about 1.5-15 μm in yet another embodiment. As used herein, "particle diameter (D50)" is intended to mean the 50% volume distribution size. The particle diameter (D50) may be obtained by measuring the distribution of the particle diameters using light scattering methods following, for example, ASTM B822-10.

The Cu particles used herein may be of any shape, For example, they can be spherical, flaky, or irregular in shape.

Particle diameter (D50 of the Ge particles, used herein may be about 1-1000 nm in one embodiment, about 5-500 nm in another embodiment, or about 10-300 nm in yet another embodiment. The particle diameter (D50) can be obtained by measuring the distribution of the particle diameters using light scattering methods following, for example, ASTM E2490-09

Particle diameter (D50) of the B particles used herein may be about 1-1000 nm in one embodiment, about 5-500 nm in another embodiment, or about 10-300 nm in yet another embodiment. The particle diameter (D50) of the B particles can be obtained in the same way as for the Ge particles described above.

In one embodiment, based on 100 parts by weight of Cu particles, the powder mixture of Cu, Ge, and B particles disclosed herein comprises about 0.1-35 parts by weight of Ge particles and 0.05-15 parts by weight of B particles, provided that the total amount of Ge and B particles is about 35 parts by weight or less. In another embodiment, the powder mixture of Cu, Ge, and B particles disclosed herein comprises about 0.1-25 parts by weight of Ge particles and 0.1-12 parts by weight of B particles, provided that the total amount of Ge and particles is about 25 parts by weight or less based on 100 parts by weight of Cu particles. In yet another embodiment, the powder mixture of Cu, Ge, and B particles disclosed herein comprises about 0.2-13 parts by weight of Ge particles and 0.1-6.5 parts by weight of B particles, provided that the total amount of Ge and B particles is about 12.5 parts by weight or less based on 100 parts by weight of Cu particles.

The powder mixture of Cu, Ge, and B may be present in the Cu-containing conductive paste at a level of about 10-95 wt %, or about 40-95 wt %, or about 60-95 wt %, based on the total weight of the Cu-containing conductive paste. The powder mixture in the above range gives the electrode sufficient conductivity.

Besides the powder mixture of Cu, Ge, and B, any other additional metal powder can be added to the Cu-containing conductive paste A powder of saver (Ag), gold (Au), palladium &Pd), aluminum (AI), platinum (Pt), nickel (Ni), tin (Sn) or mixtures or alloys of two or more of these metals can, for example, be added to the Cu-containing paste. In one embodiment, the Cu-containing conductive paste may include one or more of the following: Ag, Pt, Al, alloys of Ag and Pd, and alloys of Pt and Au, and such additional metals may be present in the Cu containing conductive paste at a total content level of up to about 60 wt %, based on the total weight of the paste.

(ii) Glass Frit

Glass frit functions to help with sintering of the conductive powder and to increase the adhesion of the electrode to the substrate. Complex oxides that could behave lust like the glass frit in the firing also can be considered as the glass frit.

The glass frit used herein may be included in the Cu-containing conductive paste at a level of about 0.1-15 wt %, or about 0.2-10 wt %, or about 0.5-8 wt %, based on the total weight of the paste. With such amount, the glass frit can serve the function above. Particle diameter (D50) of the glass hit in the paste can be about 0.1-10 μm in one embodiment, about 0.3-6 μm in another embodiment, or about 0.6-4 μm in yet another embodiment. A uniform dispersion of glass hit within the paste can be obtained when particle diameter (D50) of the glass frit are maintained within the disclosed range. The glass frit particle diameter (D50) can be measured in the same way as for the Cu particles described above.

The chemical composition of the glass frit used herein is not limited. Any glass frits can be suitable for use in the Cu-containing conductive paste. For example, a lead-boron-silicon glass frit or a lead-free bismuth glass frit like the bismuth-based oxide compositions disclosed in Table 1 of US 2012/0312368 can be used herein. The softening point of the glass frit can be about 300-800° C. When the softening point is in the referenced range, the glass frit melts properly to obtain the effects mentioned above, The softening point can be determined by differential thermal analysis (DTA).

(iii) Organic Medium

The inorganic powders such as the powder mixture of Cu, Ge, and B and the glass frit are dispersed into the organic medium to form a viscous composition called "paste", having suitable viscosity for applying on a substrate with a desired pattern. Suitable organic media should have rheological properties that provide a stable dispersion of solids, appropriate viscosity and thixotropy for applying the paste to a substrate, appropriate wettability on the substrate and the paste solids, good drying rate, and good firing properties.

There is no restriction on the composition of the organic medium used herein. The organic medium used herein may be a solution comprised of at least one organic polymer dissolved in at least one solvent.

A wide variety of organic polymers can be used herein, for example, sugar, starch, cellulose, wood rosin, epoxy resin, phenolic resin, acrylic resin, polacrylates, polyesters, polylactones, phenoxy resins, or a mixture of two or more thereof. Of these, celluloses are preferred, which include, without limitation, ethyl cellulose, cellulose nitrate, hydroxyethyl cellulose, ethylhydroxyethyl cellulose, carboxymethyl cellulose, hydroxypropyl cellulose, and mixtures and derivatives thereof.

Suitable solvents may include, without limitation, terpenes (e.g., alpha- or beta-terpineol), kerosene, dibutylphthalate, butyl carbitol, butyl carbitol acetate, hexylene glycol, alcohols with boiling points above 150° C., alcohol esters, bis(2-(2-butoxyethoxy)ethyl adipate, dibasic esters, octyl epoxy tallate, isotetradecanol, pentaerythritol ester of hydrogenated rosin, and mixtures thereof. The solvents can also include volatile liquids to promote rapid hardening after application of the paste on a substrate.

The organic medium may further contain thickeners, stabilizers, surfactants, and/or other common additives to improve the performance of the paste, such as better printability, better dispersion, and/or better stability.

The optimal amount of the organic medium in the Cu-containing conductive paste is dependent on the method of applying the paste and the specific organic medium used. Typically, the Cu-containing conductive paste disclosed herein may contain about 3-70 wt %, or about 3-65 wt %, or about 5-58 wt % of the organic medium, based the total weight of the paste.

(iv) Additional Inorganic Powder

Additional inorganic powder can be optionally added to the Cu-containing conductive paste. The additional inorganic powder is not essential. However, the additional inorganic powder can improve various properties of the electrode, such as adhesion and conductivity.

In one embodiment, the additional inorganic powders used herein may be selected from metals, metal oxides, or mixtures thereof. Exemplary metals used herein may be selected from Zn, Gd, Ce, Zr, Ti, Mn, Sn, Ru, Co, Fe, Cr, or mixtures of two or more thereof. Exemplary metal oxides used herein may be one or more oxides of Zn, Gd, Ce, Zr, Ti, Mn, Sn, Ru, Co, Fe, or Cr. The metal oxides used herein also include any compounds that can generate the metal oxides, as described above, upon firing.

The additional inorganic powder can be present in the Cu-containing conductive paste at a level of about 0.05-10 wt % in one embodiment, about 0.1-7 wt % in another embodiment, or about 0.2-6 wt % in yet another embodiment, based on the total weight of the paste.

The particle diameter (D50) of the additional inorganic, powder is not subject to any particular limitation, although an average particle size of no more than about 10 μm, and preferably no more than about 5 μm, is desirable.

The Cu-containing conductive paste disclosed herein may be formed by any suitable mixing process. For example, the paste may be prepared by simply mixing and dispersing the particles of Cu, Ge, and B, the glass frit, and the optional other inorganic particles in the organic medium.

Cu Electrodes and Methods of Manufacturing the Same

The Cu electrode is formed by, first, applying (e.g., dispensing, casting, coating, or printing) the Cu-containing conductive paste onto the surface of a substrate in a predetermined shape and at a predetermined position, drying the Cu-containing conductive paste at an elevated temperature (e.g., about 70-240° C.) for a certain duration (e.g., about 2-20 min) to partially remove the organic medium, and then, firing the Cu-containing conductive paste to remove the residual organic medium and sinter the Cu, Ge, and B particles with the glass frit and the other inorganic materials comprising the paste.

There is no restriction on the substrate. The substrate material can be selected from glass, ceramics, semiconductors, metal, or other materials that can sustain the high temperature during firing. When the substrate is a metal substrate or a semiconductor substrate, an insulating layer may be formed on the side of the substrate on which the electrode is formed.

The way of applying the Cu-containing conductive paste on the substrate is not limited and any suitable process can be used herein. Exemplary application processes useful herein include, without limitation, dispensing, screen printing, ink-jet printing, casting, spraying, gravure printing, flexo printing, stencil printing, nozzle dispensing, syringe dispensing, plating, extrusion, multiple printing, or offset printing, direct writing, and the like. In particular, screen printing is often used as it is cost effective. Also, when screen printing is used, the Cu-containing conductive paste can be applied on the substrate in a relatively short time. The pattern of the Cu containing conductive paste on the substrate can be any desired electrode pattern such as line(s), circle, or square.

The Cu-containing conductive paste that is applied over the substrate can be optionally dried for, for example, about 2-20 minutes at about 70° C.-250° C. in an oven. The drying process may be carded out at a modest temperature to harden the paste by removing its most volatile organics.

The Cu-containing conductive paste on the substrate is then fired in any atmosphere. A furnace set with a predetermined temperature and time profile can be used.

The powder mixture of Cu, Ge, and B particles sinters during firing to become the electrode that has a sufficient conductivity. The organic medium is removed by being burned off and/or carbonized during firing.

Firing may be carried out in an atmosphere composed of nitrogen, argon, or any other inert gas, or an oxygen-containing mixture such as air, or a mixed gas of oxygen and nitrogen. In one embodiment of the present disclosure, the Cu-containing conductive paste on the substrate is fired in air. The term, "firing in air" or "air firing", essentially refers to firing without replacing the atmosphere in the firing space with a gas containing no oxygen or less oxygen than the surrounding atmosphere around the firing space. In an embodiment, the air surrounding the firing equipment is used as the firing atmosphere without replacing the firing atmosphere with other gas.

The Cu containing conductive pastes disclosed herein are particularly useful in those applications wherein longer firing time is required. For example, in those applications where the substrate material (such glass or aluminum) requires lower firing temperature, such Cu-containing conductive paste may be used and the firing are conducted at lower temperature (e.g., about 400-900° C.) and longer duration (e.g., about 3 min or longer). In accordance with the present disclosure, the firing duration may be about 3 min to about 2 hr in one embodiment, about 3 min to about 1 hr in another embodiment, or about 3-18 min in yet another embodiment.

In one embodiment, the Cu-containing conductive paste disclosed herein may be used to form a resistive heater over a glass substrate. In such embodiments, the peak firing temperature needs to be set at below 800° C. and firing time at over 10 min. In another embodiment, the Cu-containing conductive paste disclosed may be applied over aluminum substrate and form electrodes for light-emitting diodes (LEDs). In such embodiments, the peak firing temperature is typically set at 680° C. or lower and the firing time at 5 min or longer.

Electrodes are formed over the substrates after the firing. The average width of the electrode can be about 10 μm to 100 mm in one embodiment, about 30 μm to 70 mm in another embodiment, or about 50 μm to 50 mm in yet another embodiment, and the average thickness can be about 1-200 μm in one embodiment, about 1-100 μm in another embodiment, or about 1-50 μm in yet another embodiment.

As demonstrated in the examples below, by replacing the more expensive Ag particles with the less expensive powder mixture of Cu and Ge particles in the conductive paste, not only is the material cost very much reduced, but the paste can be fired in air and electrodes as so obtained possess low resistivity. And, when B particles is further included in the powder mixture, the resistivity of the electrodes obtained therefrom is further reduced. Without being bound by any particular theory, it is believed that the inclusion of Ge and B particles in the powder mixture reduces oxidation of the Cu particles during firing in air. The inclusion of Ge and B particles also may accelerate the sintering of the inorganic materials comprised in the Cu-containing conductive paste. Consequently, the resistivity of the electrodes derived from such paste is reduced.

Even more surprisingly, it is found that when powder mixtures of Cu and Ge particles are used in forming the Cu-containing conductive paste, as the firing time is increased, the resistivity of the electrodes as so obtained also is increased, i.e., the electrodes becomes less conductive, However, when powder mixtures of Cu, Ge, and B particles are used in forming the Cu-containing conductive paste, even when the firing time is increased, the resistivity of the electrodes as so obtained is increased to a much lesser degree, and in certain embodiments, the resistivity of the electrodes remains unchanged or even is decreased. Therefore, the Cu-containing conductive paste disclosed herein (containing powder mixtures of Cu, Ge, and B particles) is more beneficial in those applications wherein longer firing time is required.

Articles Comprising Structural Elements With the Cu Electrodes

Further disclosed herein are articles that comprise a structural element and the structural element is comprised of a substrate and Cu electrodes (described above) formed thereon. The articles disclosed herein include, without limitation, hybrid integrated circuit (in which the substrate materials include, without limitation, alumina, glass and low temperature co-fired ceramic); resistors (such as chip resistors, network resistors, and voltage dependent resistor); ceramic capacitors; super capacitors; resistive heaters; and fuel sensors.

EXAMPLE

Inorganic Powder:

The following it powders were used in these examples.

Cu: copper (Cu) powders (with various particle diameter (D50)) purchased from Mitsui Mining & Smelting Co., Ltd. (Japan);

Ge: germanium (Ge) nano particles (particle diameter (D50)=70-120 nm) and purchased from Foreman Scientific (Beijing) Co., Ltd. (China);

B: boron (B) nano particles (particle, diameter (D50)=100 nm) purchased from Beijing Dk nano S&T Ltd. (China).

Comparative Examples CE1-CE7 and Examples E1-E3

In each of CE1-CE7 and E1-E3, a thick film paste was prepared as follows: 8.3 g inorganic powder(s) (as listed in Table 1 for each sample); 0.29 g Bi—Zn—B—Al—Ba—Si oxide glass frit similar to the bismuth-based oxide compositions disclosed in Table 1 of US 2012/0312368 (with D50 of 0.8 μm); 0.02 g hydrogenated castor oil; 1.1 g a solution comprised of 10-20 wt % ethyl cellulose dissolved in terpineol; and 0.29 g 2,2,4-trimethyl-1,3-pentanediol monoisobutyrate were mixed in a mixer (manufactured by Thinky USA Inc. (U.S.A.) with the model name ARE-310) at 2000 rpm for 1 min, followed by grinding for 5 min by hand.

In each sample, and using a stencil, the thick film paste prepared above was cast on the surface of a silicon cell (silicon nitride coated 6" silicon wafer (180 μm thick) obtained from JA Solar Holdings Co. Ltd) to form a 30 μm thick line of paste layer (2 mm wide and 30 mm long). The paste layer was then dried at 100° C. for 5-10 min. The dried paste was fired in air using an IR furnace (manufactured by Despatch Instruments (P. R. C.) with the model name CF-7210). The temperature profile of the IR furnace was set at 580-610-630-650-820-900° C. and belt speed at out 560 cm/min (equivalent to 1.35 in firing duration). Electrodes on the silicon cell were then obtained.

The sheet resistance of the electrode on the surface of the silicon cell was measured by a four-probe method using a sheet resistivity meter (manufactured by Napson Corp. (Japan) with the model name RT3000/RG7) and the thickness of the electrode was measured using a Veeco Surface Profiler (manufactured by Veeco Instruments Inc. with the model name Dektak 150). The resistivity of the electrode was calculated by the equation below and tabulated in Table 1:

ρ(Resistivity)=sheet resistance×thickness×geometry correction=sheet resistance×thickness×1.9475/4.5324

The results demonstrate that when Cu particles alone were used in the thick film paste (CE1), the electrodes prepared therefrom had very high resistivity. However, when a mixture of Ge particles and Cu particles with a D50 not less than 1 μm were mixed in the thick film paste, the resistivities of the electrodes prepared from such thick film pastes were decreased dramatically (CE4-CE7). Moreover, in addition to Cu particles with a D50 not less than 1 μm, when Ge and B particles were both added in the thick film paste, the resistivity of the electrodes prepared from such thick film pastes were further decreased (E1-E4).

TABLE 1

| Samples | Inorganic Powders (weight ratio) | D50 of Cu (μm) | Resistivity (ohm-cm) |
|---|---|---|---|
| CE1 | Cu | 5.4 | 9.37E+02 |
| CE2 | Cu:Ge (100:5) | 0.78 | 3.60E+02 |
| CE3 | Cu:Ge:B (100:5:1) | 0.78 | 1.20E+03 |
| CE4 | Cu:Ge (100:5) | 3.6 | 1.08E−04 |
| E1 | Cu:Ge:B (100:5:1) | 3.6 | 4.07E−05 |
| CE5 | Cu:Ge (100:5) | 5.4 | 3.37E−05 |
| E2 | Cu:Ge:B (100:5:1) | 5.4 | 2.13E−05 |
| CE6 | Cu:Ge (100:5) | 8.3 | 5.24E−05 |
| E3 | Cu:Ge:B (100:5:1) | 8.3 | 3.33E−05 |
| CE7 | Cu:Ge (100:8) | 5.4 | 3.30E−05 |
| E4 | Cu:Ge:B (100:8:1) | 5.4 | 2.28E−05 |

Comparative Examples CE8-CE16 and Examples E5-E20

In the same way as described above for E1, in each of CE8-CE15 and E5-E20, a thick film paste was prepared and the thick film paste as so prepared was fired over a silicon cell to form an electrode. During the firing process, the temperature profile was set at 560-610-630-650-700-700° C. and belt speed was set at 76.2 cm/min (equivalent to 9.7 min long firing duration), 127 cm/min (equivalent to 5.8 min long firing duration), or 280 cm/min (equivalent to 2.7 min firing duration). The resistivity of the electrode was determined as described for E1 and tabulated in Table 2. Also, the Cu particles used in these samples have a D50 of 5.4 μm. And, the paste compositions used in E13-E15 are the same.

Here again, it is shown that, compared to those thick film paste comprising powder mixtures of Cu and Ge particles, when powder mixtures of Cu, Ge, and B particles were added in the thick film paste and provided that the combined content level of Ge and B did not exceed 12.5 parts by weight (based on 100 parts by weight of Cu), the resistivities of the electrodes prepared therefrom were further decreased (E5-E12 and E17-E18).

Also, as shown by CE8-CE15, when a powder mixture of Cu and Ge were used in the thick film paste and the paste was applied and fired over a substrate to obtain the electrode, the resistivities of the electrodes varied depending on the firing time that was employed. Specifically, as the firing time increased, the resistivities of the electrodes as so obtained also increased greatly. In certain cases (e.g., CE8-CE9), as the firing time was increased from 21 min to 5.8 min, the electrodes as so obtained became non-conductive. That is, powder mixture of Cu and Ge was not useful in those applications wherein longer firing time is required.

However, as shown by E5-E20, when a powder mixture of Cu, Ge, and B was used in the thick film paste and the paste was applied and fired over a substrate to obtain the electrodes, there were no or very little changes to the resistivities of the electrodes a the firing time that was employed increased. That is, the powder mixture of Cu, Ge, and B were particularly useful in those applications wherein longer firing time is required.

TABLE 2

| | | Resistivity (ohm-cm) | | |
|---|---|---|---|---|
| Sample | Inorganic Powders (weight ratio) | Belt Speed @280 cm/min (Firing duration @2.7 min) | Belt Speed @127 cm/min (Firing duration @5.8 min) | Belt Speed @76.2 cm/min (Firing duration @9.7 min) |
| CE8 | Cu:Ge (100:1) | 1.61E−01 | 3.90E+03 | 6.42E+03 |
| E5 | Cu:Ge:B (100:1:1) | 3.11E−04 | 1.07E−03 | 6.35E−03 |
| CE9 | Cu:Ge (100:2) | 8.61E−04 | 2.99E+03 | n/d |
| E6 | Cu:Ge:B (100:2:1) | 1.93E−04 | 2.45E−04 | n/d |
| CE10 | Cu:Ge (100:4) | 2.05E−04 | 3.71E−03 | 2.41E+03 |
| E7 | Cu:Ge:B (100:4:1) | 9.52E−05 | 6.10E−05 | 2.26E−03 |
| CE11 | Cu:Ge (100:6) | 1.27E−04 | 1.55E−04 | 2.09E+03 |
| E8 | Cu:Ge:B (100:6:0.5) | 7.81E−05 | 5.27E−05 | 1.82E−02 |
| E9 | Cu:Ge:B (100:6:1) | 6.39E−05 | 3.85E−05 | 7.86E−02 |
| E10 | Cu:Ge:B (100:6:2) | 5.73E−05 | 2.70E−05 | n/d |
| E11 | Cu:Ge:B (100:6:4.1) | 7.84E−05 | 3.98E−05 | n/d |
| E12 | Cu:Ge:B (100:6:6.05) | 1.10E−04 | 4.22E−05 | 3.25E−05 |
| E13 | Cu:Ge:B (100:6:7) | 4.37E−04 | 8.16E−05 | 1.02E−04 |
| E14 | Cu:Ge:B (100:6:7) | 1.82E−04 | 6.29E−05 | 3.68E−05 |
| E15 | Cu:Ge:B (100:6:7) | 1.72E−04 | 5.97E−05 | 3.50E−05 |
| E16 | Cu:Ge:B (100:6:8) | 1.42E−04 | 5.74E−05 | 4.60E−05 |
| CE12 | Cu:Ge (100:8) | 9.13E−05 | 5.23E−05 | n/d |
| E17 | Cu:Ge:B (100:8:1) | 5.67E−05 | 2.94E−05 | n/d |
| CE13 | Cu:Ge (100:11) | 8.75E−05 | 8.43E−05 | n/d |
| E18 | Cu:Ge:B (100:11:1) | 5.72E−05 | 3.82E−05 | n/d |
| CE14 | Cu:Ge (100:15.5) | 1.09E−04 | 7.74E−05 | 3.42E−04 |
| E19 | Cu:Ge:B (100:15.5:1) | 2.25E−04 | 6.19E−05 | 4.09E−05 |
| CE15 | Cu:Ge (100:20) | 6.25E−05 | 6.53E−05 | 1.62E−04 |
| E20 | Cu:Ge:B (100:20:1) | 1.03E−04 | 8.39E−05 | 4.91E−05 |

Comparative Examples CE16-CE18 and Examples E21-E25

In the same way as described above for E1, in each of CE16-CE18 and E21-E25, a thick film paste was prepared and the thick film paste as so prepared was cast on the surface of a silicon cell followed by drying. Thereafter the silicon cell bearing the paste was fired in air using a box furnace. During the firing process, the temperature was set at 620° C. for a fixed time of 5 min, 10 min, 15 min, 20 min, or 25 min. The resistivity of the electrode was determined as described for E1 and tabulated in Table 3.

Here again, it is demonstrated that as the firing time was increased, the resistivities of the electrodes as so obtained were increased greatly, and in certain cases to an extent that the electrodes became non-conductive (see CE16-CE18). However, when a powder mixture of Cu, Ge, and B was used in the thick film paste and the paste was applied and fired over a substrate to obtain the electrodes, there were no or very little changes to the resistivities of the electrodes as the firing time was varied (see E21-E25).

TABLE 3

| Sample | Inorganic Powders (weight ratio) | Resistivity (ohm-cm) | | | | |
|---|---|---|---|---|---|---|
| | | Firing time @5 min | Firing time @10 min | Firing time @15 min | Firing time @20 min | Firing time @25 min |
| CE16 | Cu:Ge (100:4) | 7.85E+02 | 1.07E+03 | 2.10E+03 | 1.47E+03 | 1.18E+03 |
| E21 | Cu:Ge:B (100:4:1) | 8.22E−05 | 1.32E−04 | 6.28E−04 | 6.49E+02 | 2.51E+02 |
| CE17 | Cu:Ge (100:6) | 7.95E+02 | 1.70E+03 | 1.82E+03 | 1.20E+03 | 1.27E+03 |
| E22 | Cu:Ge:B (100:6:1) | 5.17E−05 | 1.58E−04 | 2.55E−03 | 6.24E+02 | 3.40E+02 |
| E23 | Cu:Ge:B (100:6:2) | 4.01E−05 | 3.59E−05 | 3.28E−05 | 5.26E−05 | 6.72E−05 |
| E24 | Cu:Ge:B (100:6:8) | 2.45E−04 | 2.68E−04 | 1.71E−04 | 2.65E−04 | 8.28E−04 |
| CE18 | Cu:Ge (100:20) | 3.47E−04 | 2.39E−02 | 3.53E+03 | 2.09E+03 | 1.60E+03 |
| E25 | Cu:Ge:B (100:20:1) | 3.48E−04 | 2.33E−04 | 1.39E−03 | 1.45E−03 | 1.58E−03 |

What is claimed is:

1. A copper-containing (Cu-containing) conductive paste comprising:
   a) about 10-95 wt % of a powder mixture of Cu, germanium (Ge), and boron (B) particles, and
   b) about 0.1-15 wt % of a glass frit, dispersed in
   c) an organic medium,
with the total wt % of all components comprising the paste totaling to 100 wt %, and wherein, (i) the powder mixture comprises about 0.1-35 parts by weight of the Ge particles and about 0.05-15 parts by weight of the B particles, based on 100 parts by weight of the Cu particles, and provided that the combined content level of Ge and B particles is about 35 parts by weight or less; and (ii) the organic medium is comprised of at least one organic polymer dissolved in at least one solvent.

2. The Cu-containing conductive paste of claim 1, wherein, the powder mixture comprises about 0.1-25 parts by weight of the Ge particles and about 0.1-12 parts by weight of the B particles, based on 100 parts by weight of the Cu particles, and provided that the combined content level of Ge and B particles is about 25 parts by weight or less.

3. The Cu-containing conductive paste of claim 2, wherein, the powder mixture comprises about 0.2-13 parts by weight of the Ge particles and about 0.1-6.5 parts by weight of the B particles, based on 100 parts by weight of the Cu particles, and provided that the combined content level of Ge and B particles is about 12.5 parts by weight or less.

4. The Cu-containing conductive paste of claim 1, wherein, the Cu particles have a particle diameter (D50) of about 1-50 μm.

5. The Cu-containing conductive paste of claim 4, wherein, the Cu particles have a particle diameter (D50) of about 1.5-30 μm.

6. The Cu-containing conductive paste of claim 5, wherein, the Cu particles have a particle diameter (D50) of about 1.5-15 μm.

7. The Cu-containing conductive paste of claim 1, wherein, the Ge particles have a particle diameter (D50) of about 1-1000 nm, and the B particles have a particle diameter (D50) of about 1-1000 nm.

8. An article comprising a structural element, wherein the structural element is comprised of a substrate and at least one Cu electrode, wherein the at least one Cu electrode is formed by: (I) applying a Cu-containing conductive paste onto one side of the substrate in a predetermined shape and at a predetermined position; (II) drying the Cu-containing conductive paste; and (III) firing the Cu-containing conductive paste to form the at least one Cu electrode,
wherein, the Cu-containing conductive paste comprises:
   a) about 10-95 wt % of a powder mixture of Cu, Ge, and B particles, and
   b) about 0.1-15 wt % of a glass frit, dispersed in
   c) an organic medium,
with the total wt % of all components comprised in the paste totaling to 100 wt %, and wherein, (i) the powder mixture comprises about 0.01-35 parts by weight of the Ge particles and about 0.05-15 parts by weight of the B particles, based on 100 parts by weight of the Cu particles; and (ii) the organic medium is comprised of at least one organic polymer dissolved in at least one solvent.

9. The article of claim 8, wherein during step (III), the Cu-containing conductive paste is fired in air.

10. The article of claim 9, wherein during step (III), the Cu-containing conductive paste is fired in air for about 3 min to 2 hr.

11. The article of claim 10, wherein during step (III), the Cu-containing conductive paste is fired in air for about 3 min to 1 hr.

12. The article of claim 11, wherein during step (III), the Cu-containing conductive paste is fired in air for about 3-18 min.

13. The article of claim 8, which is selected from the group consisting of hybrid integrated circuit, resistors, ceramic capacitors, super capacitors, resistive heaters, and fuel sensors.

* * * * *